United States Patent
Bhandari et al.

(10) Patent No.: US 9,627,652 B2
(45) Date of Patent: Apr. 18, 2017

(54) ORGANIC LIGHT EMITTING DIODE WITH LIGHT EXTRACTING ELECTRODE

(71) Applicant: Vitro S.A.B. de C.V., Neuvo Leon (MX)

(72) Inventors: Abhinav Bhandari, Cranberry, PA (US); Harry Buhay, Allison Park, PA (US)

(73) Assignee: Vitro, S.A.B. de C.V., Nuevo León (MX)

( * ) Notice: Subject to any disclaimer, the term of this patent is extended or adjusted under 35 U.S.C. 154(b) by 0 days.

(21) Appl. No.: 14/519,773

(22) Filed: Oct. 21, 2014

(65) Prior Publication Data
US 2015/0188089 A1 Jul. 2, 2015

Related U.S. Application Data

(60) Provisional application No. 61/920,792, filed on Dec. 26, 2013.

(51) Int. Cl.
*H01L 51/52* (2006.01)
*H01L 51/56* (2006.01)

(52) U.S. Cl.
CPC ...... *H01L 51/5268* (2013.01); *H01L 51/5203* (2013.01); *H01L 51/5215* (2013.01); *H01L 51/5262* (2013.01); *H01L 51/56* (2013.01); *H01L 2251/5369* (2013.01)

(58) Field of Classification Search
CPC ............. H01L 51/5268; H01L 51/5215; H01L 51/5262
See application file for complete search history.

(56) References Cited

U.S. PATENT DOCUMENTS

| | | |
|---|---|---|
| 2003/0062520 A1 | 4/2003 | Toguchi et al. |
| 2006/0250084 A1 | 11/2006 | Cok et al. |
| 2008/0012471 A1 | 1/2008 | Cok |
| 2009/0142602 A1 | 6/2009 | Medwick et al. |
| 2011/0146767 A1 | 6/2011 | Lu |
| 2014/0027753 A1 | 1/2014 | Yamana et al. |

FOREIGN PATENT DOCUMENTS

| | | |
|---|---|---|
| JP | 08222374 A | 8/1996 |
| WO | 2007127870 A2 | 11/2007 |
| WO | 2013001891 A1 | 1/2013 |
| WO | 2013056155 A2 | 4/2013 |
| WO | 2013083712 A1 | 6/2013 |

OTHER PUBLICATIONS

Mingli Yan et al; "Silver Nanocrystals with Special Shapes: Controlled Synthesis and their Surface-Enhanced Raman Scattering Properties", RSC Advances, vol. 4, No. 1, Nov. 5, 2013, p. 98, XP055169388.
PCT Search Report, PCT/US2014/061568, dated Feb. 20, 2015.

*Primary Examiner* — Amar Movva
(74) *Attorney, Agent, or Firm* — Andrew C. Siminerio

(57) ABSTRACT

An organic light emitting diode (10) includes a substrate (20), a first electrode (12), an emissive active stack (14), and a second electrode (18). At least one of the first and second electrodes (12, 18) is a light extracting electrode (26) having a metallic layer (28). The metallic layer (28) includes light scattering features (29) on and/or in the metallic layer (28). The light extracting features (29) increase light extraction from the organic light emitting diode (10).

16 Claims, 5 Drawing Sheets

ORGANIC LIGHT EMITTING DIODE WITH LIGHT EXTRACTING ELECTRODE

CROSS REFERENCE TO RELATED APPLICATION

This application claims priority to U.S. Provisional Patent Application No. 61/920,792, filed Dec. 26, 2013, which is herein incorporated by reference in its entirety.

NOTICE OF GOVERNMENT SUPPORT

This invention was made with Government support under Contract No. DE-EE-0003209 awarded by the Department of Energy. The United States government may have certain rights in this invention.

BACKGROUND OF THE INVENTION

Field of the Invention

This invention relates generally to organic light emitting diodes (OLEDs) and, more particularly, to an organic light emitting diode having a conductive electrode with enhanced light emitting properties.

Technical Considerations

An organic light emitting diode (OLED) is a device having an emissive layer that emits electromagnetic radiation, such as visible light, in response to the application of an electric current. The emissive layer is located between two electrodes (an anode and a cathode). When electric current is passed between the anode and the cathode (i.e., through the emissive layer), the emissive layer emits electromagnetic energy. OLEDs are used in numerous applications, such as television screens, computer monitors, mobile phones, personal digital assistants (PDAs), watches, lighting, and various other electronic devices.

OLEDs provide numerous advantages over conventional inorganic devices, such as liquid crystals used for displays and incandescent or compact fluorescent lamps (CLFs) and other lighting applications. For example, an OLED functions without the need for a back light. In low ambient light, such as a dark room, an OLED screen can achieve a higher contrast ratio than conventional liquid crystal displays, OLEDs are also thinner, lighter, and more flexible than liquid crystal displays. OLEDs require less energy to operate and can provide cost savings compared to incandescent or compact fluorescent lamps.

However, one disadvantage with OLED devices is that a significant amount of the electromagnetic energy generated by the emissive layer is not emitted from the OLED device. A large portion of the generated electromagnetic energy is trapped within the OLED device due to the "optical waveguide effect" caused by the reflection of electromagnetic radiation at the interfaces of the various layers of the OLED device. In a typical OLED fighting device, about 80% of the visible light emitted from the emissive layer is trapped inside the OLED device due to this optical waveguide effect. Thus, only about 20% of the light generated by the emissive layer is actually emitted by the OLEO device.

It would be advantageous to provide an OLED device in which more electromagnetic radiation produced by the emissive layer is emitted from the OLEO device, compared to conventional OLED devices. For example, it would be advantageous to provide a way to reduce the optical waveguide effect in at least one layer of the OLEO device to increase the OLED emission. It would also be advantageous to provide a method of making an OLED device having a reduced optical waveguide effect to promote increased electromagnetic emission from the OLED device.

SUMMARY OF THE INVENTION

Aspects of the invention will now be described in the following numbered clauses:

Clause 1

An organic light emitting diode comprises a substrate; a first electrode; an emissive active stack; and a second electrode. At least one of the first electrode and the second electrode is a light extracting electrode comprising a metallic layer. The metallic layer comprises light scattering features on and/or in the metallic layer.

Clause 2

The organic light emitting diode of clause 1, wherein the light scattering features are selected from the group consisting of projections, dendrites, cracks, voids, regions of different density than the metallic layer, and regions of different chemical composition than the metallic layer.

Clause 3

The organic light emitting diode of clauses 1 or 2, wherein the light scattering features comprise projections.

Clause 4

The organic light emitting diode of any of clauses 1 to 3, wherein the light scattering features comprise projections having a height in the range of 5 nm to 100 nm, such as 10 nm to 80 nm, such as 20 nm to 60 nm, such as 30 nm to 60 nm, such as 30 nm to 50 nm.

Clause 5

The organic light emitting diode of any of clauses 1 to 4, wherein the light scattering features comprise projections, and wherein at least some of the projections have a minimum height of 5 nm, such as 10 nm, such as 15 nm, such as 20 nm, such as 25 nm, such as 30 nm, such as 35 nm, such as 40 nm, such as 50 nm.

Clause 6

The organic light emitting diode of any of clauses 1 to 5, wherein the light scattering features comprise projections, and wherein at least some of the projections have a maximum height of 100 nm, such as 90 nm, such as 80 nm, such as 70 nm, such as 60 nm, such as 55 nm, such as 50 nm, such as 45 nm, such as 40 nm.

Clause 7

The organic light emitting diode of any of clauses 1 to 6, wherein at least some of the light scattering features are dendrite-shaped.

Clause 8

The organic light emitting diode of clause 7, wherein at least some of the dendrite-shaped light scattering features have a diameter in the range of 10 microns to 50 microns, such as 10 microns to 40 microns, such as 20 microns to 40 microns, such as 30 microns to 40 microns.

Clause 9

The organic light emitting diode of any of clauses claims 1 to 8, wherein the metallic layer comprises at least one metal selected from the group consisting of platinum, iridium, osmium, palladium, aluminum, gold, copper, silver, and mixtures and/or alloys thereof.

Clause 10

The organic light emitting diode of any of clauses 1 to 9, wherein the metallic layer comprises metallic silver.

Clause 11

The organic light emitting diode of any of clauses 1 to 10, wherein the light extracting electrode is a multilayer structure comprising the metallic layer with the light scattering features.

Clause 12

The organic light emitting diode of any of clauses 1 to 11, wherein the light extracting electrode is an anode.

Clause 13

The organic light emitting diode of any of clauses 1 to 12, wherein the second electrode is transparent.

Clause 14

The organic light emitting diode of any of clauses 1 to 13, wherein the second electrode is closer to the substrate than the first electrode.

Clause 15

The organic light emitting diode of any of clauses 1 to 14, including an underlayer located between the metallic layer and the substrate.

Clause 16

The organic light emitting diode of clause 15, wherein the underlayer comprises one or more metal oxide materials selected from the group consisting of oxides of silicon, titanium, aluminum, zirconium, phosphorus, hafnium, niobium, zinc, bismuth, lead, indium, tin, and alloys and mixtures thereof.

Clause 17

The organic light emitting diode of clauses 15 or 16, wherein the underlayer is selected from the group consisting of a homogeneous layer, a gradient layer, and a multilayer structure.

Clause 18

The organic light emitting diode of any of clauses 15 to 17, wherein the underlayer comprises at least one of a zinc oxide layer and a zinc stannate layer.

Clause 19

The organic light emitting diode of any of clauses 15 to 18, wherein the underlayer comprises a zinc oxide layer over a zinc stannate layer.

Clause 20

The organic light emitting diode of any of clauses 1 to 19, including a primer layer over the metallic layer.

Clause 21

The organic light emitting diode of clause 20, wherein the primer layer comprises a material selected from the group consisting of titanium, silicon, silicon dioxide, silicon nitride, silicon oxynitride, nickel-chrome alloys, zirconium, aluminum, alloys of silicon and aluminum, alloys containing cobalt and chromium, and mixtures thereof.

Clause 22

The organic light emitting diode of clauses 20 or 21, wherein the primer layer comprises titanium.

Clause 23

The organic light emitting diode of any of clauses 1 to 22, including a top layer over the metallic layer.

Clause 24

The organic light emitting diode of clause 23, wherein the top layer comprises at least one oxide material selected from the group consisting of oxides of zinc, tin, zirconium, aluminum, silicon, indium, and mixtures thereof.

Clause 25

The organic light emitting diode of clauses 23 or 24, wherein the top layer comprises zinc stannate.

Clause 26

The organic light emitting diode of clauses 23 or 24, wherein the top layer comprises a mixture of silica and alumina.

Clause 27

The organic light emitting diode of clauses 23 or 24, wherein the top layer comprises a conductive layer selected from the group consisting of indium tin oxide, aluminum zinc oxide, and indium zinc oxide.

Clause 28

The organic light emitting diode of any of clauses 1 to 27, wherein the first electrode is a cathode selected from the group consisting of barium, calcium, and magnesium.

Clause 29

The organic light emitting diode of any of clauses 1 to 28, wherein the first electrode is opaque and/or reflective.

Clause 30

The organic light emitting diode of any of clauses 1 to 29, wherein the substrate comprises glass.

Clause 31

The organic light emitting diode of any of clauses 1 to 30, wherein the light extracting electrode has a sheet resistance in the range of 1Ω/□ to 20Ω/□, such as 1Ω/□ to 15Ω/□, such as 1Ω/□ to 10Ω/□, such as 1Ω/□ to 8Ω/□, such as 2Ω/□ to 8Ω/□, such as 4Ω/□ to 8 Ω/□.

Clause 32

The organic light emitting diode of any of clauses 1 to 31, wherein the light extracting electrode has a visible light transmittance in the range of 50% to 97%, such as 70% to 95%, such as 75% to 95%, such as 80% to 95%, such as 85% to 95%, such as 88% to 95%, such as 90% to 95%.

Clause 33

The organic light emitting diode of any of clauses 1 to 32, wherein the light extracting electrode has haze in the range of 0.5% to 10%, such as 1% to 10%, such as 1% to 8%.

Clause 34

The organic light emitting diode of any of clauses 1 to 33, wherein the light extracting electrode has a root mean square surface roughness in the range of 5 nm to 60 nm, such as 25 nm to 60 nm, such as 40 nm to 60 nm, such as 50 nm to 60 nm.

Clause 35

The organic light emitting diode of any of clauses 1 to 34, wherein the substrate comprises glass, wherein the first electrode is a cathode, wherein the light extracting electrode is an anode, wherein the light scattering features comprise projections extending from a first surface of the substrate, and wherein at least some of the projections have a height in the range of 20 nm to 60 nm.

Clauses 36

The organic light emitting diode of any of clauses 1 to 35, wherein the substrate comprises glass, wherein the first electrode is a cathode, wherein the first electrode is opaque and/or reflective, wherein the light extracting electrode is an anode, wherein the anode is closer to the substrate than the first electrode, wherein the metallic layer comprises metallic silver, wherein the light scattering features comprise projections extending from a first surface of the substrate, and wherein at least some of the projections have a height in the range of 20 nm to 60 nm.

Clause 37

The organic light emitting diode of clauses 36 or 36, including an underlayer positioned between the metallic layer and the substrate, wherein the underlayer comprises a zinc oxide layer over a zinc stannate layer.

Clause 38

The organic light emitting diode of any of clauses 35 to 37, including a primer layer over the metallic layer, wherein the primer layer comprises titanium.

Clause 39

The organic light emitting diode of any of clauses 35 to 38, including a top layer over the metallic layer, wherein the top layer is selected from the group consisting of zinc stannate, a mixture of silica and alumina, indium tin oxide, aluminum zinc oxide, and indium zinc oxide.

Clause 40

A method of making an organic light emitting diode, comprising: providing a first electrode, an emissive active stack, and a second electrode over a substrate. At least one of the first and second electrodes is a fight extracting electrode comprising a metallic layer. The metallic layer comprises light scattering features on and/or in the metallic layer.

Clause 41

The method of clause 40, wherein the light scattering features are selected from the group consisting of projections, dendrites, cracks, voids, regions of different density than the metallic layer, and regions of different chemical composition than the metallic layer.

Clause 42

The method of clauses 40 or 41, wherein the light scattering features comprise projections.

Clause 43

The method of any of clauses 40 to 42, wherein the light scattering features comprise projections having a height in the range of 5 nm to 100 nm, such as 10 nm to 80 nm, such as 20 nm to 60 nm, such as 30 nm to 60 nm, such as 30 nm to 50 nm.

Clause 44

The method of any of clauses 40 to 43, wherein the light scattering features comprise projections, and wherein at least some of the projections have a minimum height of 5 nm, such as 10 nm, such as 15 nm, such as 20 nm, such as 25 nm, such as 30 nm, such as 35 nm, such as 40 nm, such as 50 nm.

Clause 45

The method of any of clauses 40 to 44, wherein at least some of the projections have a maximum height of 100 nm, such as 90 nm, such as 80 nm, such as 70 nm, such as 60 nm, such as 55 nm, such as 50 nm, such as 45 nm, such as 40 nm.

Clause 46

The method of any of clauses 40 to 45, wherein at least some of the light scattering features are dendrite-shaped.

Clause 47

The method of clause 45, wherein at least some of the dendrite-shaped light scattering features have a diameter in the range of 10 microns to 50 microns, such as 10 microns to 40 microns, such as 20 microns to 40 microns, such as 30 microns to 40 microns.

Clause 48

The method of any of clauses 40 to 47, wherein the light extracting electrode is an anode.

Clause 49

The method of any of clauses 40 to 48, wherein the light scattering features are provided by at least one process selected from: exposing the metallic layer to oxygen; heating the metallic layer; exposing the metallic layer to a laser; exposing the metallic layer to an oxygen plasma treatment; and doping the metallic layer.

Clause 50

The method of any of clauses 40 to 49, including exposing the metallic layer to oxygen for a period of time in the range of 1 minute to 20 minutes, such as 1 minute to ten minutes, such as 1 minute to 5 minutes, such as 3 minutes to 5 minutes, such as 3 minutes to 4.5 minutes.

Clause 51

The method of any of clauses 40 to 50, including heating the metallic layer to a temperature in the range of 400° C. to 1000° C., such as 500° C. to 900° C., such as 600° C. to 800° C., such as 700° C. to 800° C., such as 700° C. to 750° C.

Clause 52

The method of any of clauses 40 to 51, including doping the metallic layer with a dopant selected from the group consisting of copper, aluminum, and zinc.

Clause 53

The method of any of clauses 40 to 52, including positioning the second electrode closer to the substrate than the first electrode.

Clause 54

The method of any of clauses 40 to 53, including providing an underlayer between the metallic layer and the substrate.

Clause 55

The method of clause 54, wherein the underlayer comprises at least one of a zinc oxide layer and a zinc stannate layer.

Clause 56

The method of any of clauses 40 to 55, including providing a primer layer over the metallic layer.

Clause 57

The method of clause 56, wherein the primer layer comprises titanium.

Clause 58

The method of any of clauses 40 to 57, including providing a top layer over the metallic layer.

Clause 59

The method of clause 58, wherein the top layer is selected from the group consisting of zinc stannate, a mixture of silica and alumina, indium tin oxide, aluminum zinc oxide, indium zinc oxide, and mixtures thereof.

Clause 60

The method of any of clauses 40 to 59, wherein the metallic layer comprises saver.

Clause 61

A light extracting electrode, comprising: a metallic layer, wherein the metallic layer comprises light scattering features on and/or in the metallic layer.

Clause 62

The light extracting electrode of clause 61, wherein the light scattering features are selected from the group consisting of projections, dendrites, cracks, voids, regions of different density than the metallic layer, and regions of different chemical composition than the metallic layer.

Clause 63

The light extracting electrode of clauses 61 or 62, wherein the light scattering features comprise projections.

Clause 64

The light extracting electrode of any of clauses 61 to 63, wherein the light scattering features comprise projections having a height in the range of 10 nm to 80 nm, such as 20 nm to 60 nm, such as 30 nm to 60 nm, such as 30 nm to 50 nm.

Clause 65

The light extracting electrode of any of clauses 61 to 64, wherein the light scattering features comprise projections, and wherein at least some of the projections have a minimum height of 5 nm, such as 10 nm, such as 15 nm, such as 20 nm, such as 25 nm, such as 30 nm, such as 35 nm, such as 40 nm, such as 50 nm.

Clause 66

The light extracting electrode of any of clauses 61 to 65, wherein the light scattering features comprise projections, and wherein at least some of the projections have a maximum height of 100 nm, such as 90 nm, such as 80 nm, such as 70 nm, such as 60 nm, such as 55 nm, such as 50 nm, such as 45 nm, such as 40 nm.

Clause 67

The light extracting electrode of any of clauses 61 to 66, wherein at least some of the light scattering features are dendrite-shaped.

Clause 68

The light extracting electrode of clause 67, wherein at least some of the dendrite-shaped light scattering features have a diameter in the range of 10 microns to 50 microns, such as 10 microns to 40 microns, such as 20 microns to 40 microns, such as 30 microns to 40 microns.

Clause 69

The light extracting electrode of any of clauses 61 to 67, wherein the metallic layer comprises at least one metal selected from the group consisting of platinum, iridium, osmium, palladium, aluminum, gold, copper, silver, and mixtures and/or alloys thereof.

Clause 70

The light extracting electrode of any of clauses 61 to 69, wherein the metallic layer comprises metallic silver.

Clause 71

The light extracting electrode of any of clauses 61 to 70, wherein the light extracting electrode is a multilayer structure comprising the metallic layer with the light scattering features.

Clause 72

The light extracting electrode of any of clauses 61 to 71, including an underlayer comprising one or more metal oxide materials selected from the group consisting of oxides of silicon, titanium, aluminum, zirconium, phosphorus, hafnium, niobium, zinc, bismuth, lead, indium, tin, and alloys and mixtures thereof.

Clause 73

The light extracting electrode of clause 72, wherein the underlayer comprises at least one of a zinc oxide layer and a zinc stannate layer.

Clause 74

The light extracting electrode of clauses 72 or 73, wherein the underlayer comprises a zinc oxide layer over a zinc stannate layer.

Clause 75

The light extracting electrode of any of clauses 61 to 74, including a primer layer over the metallic layer, wherein the primer layer comprises a material selected from the group consisting of titanium, silicon, silicon dioxide, silicon nitride, silicon oxynitride, nickel-chrome alloys, zirconium, aluminum, alloys of silicon and aluminum, alloys containing cobalt and chromium, and mixtures thereof.

Clause 76

The light extracting electrode of clause 75, wherein the primer layer comprises titanium.

Clause 77

The light extracting electrode of any of clauses 61 to 76, including a top layer over the metallic layer.

Clause 78

The light extracting electrode of clause 77, wherein the top layer comprises at least one oxide material selected from the group consisting of oxides of zinc, tin, zirconium, aluminum, silicon, indium, and mixtures thereof.

Clause 79

The light extracting electrode of clauses 77 or 78, wherein the top layer comprises zinc stannate.

Clause 80

The light extracting electrode of clauses 77 or 78, wherein the top layer comprises a mixture of silica and alumina.

Clause 81

The light extracting electrode of clauses 77 or 78, wherein the top layer comprises a conductive layer selected from the group consisting of indium tin oxide, aluminum zinc oxide, and indium zinc oxide.

Clause 82

The use of an organic light emitting diode of any of clauses 1 to 39 in a display device, particularly a display device selected from the group consisting of a computer monitor, a computer screen, a mobile phone, a television screen, a personal digital assistant, a watch, and a lighting device.

Clause 83

The use of a light extracting electrode of any of clauses 61 to 81 in an OLEO device.

Clause 84

The use of a light extracting electrode of any of clauses 61 to 81 in a display device, particularly in a display device selected from the group consisting of a computer monitor, a computer screen, a mobile phone, a television screen, a personal digital assistant, a watch, and a lighting device.

DESCRIPTION OF THE PREFERRED ASPECTS

Figure 1:
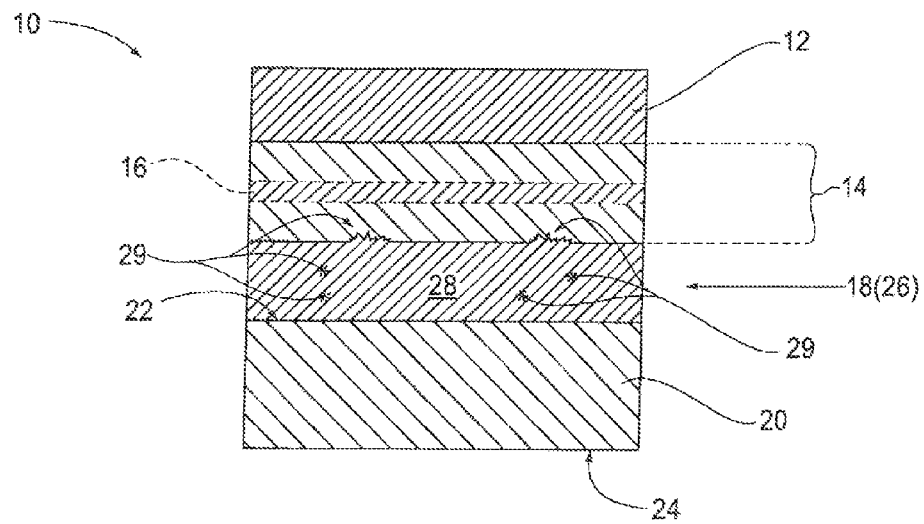
FIG. 1 is a side, sectional view illustrating an OLED device of the invention incorporating a light scattering electrode of the invention.

As used herein, spatial or directional terms, such as "left", "right", "inner", "outer", "above", "below", and the like, relate to the invention as it is shown in the drawing figures. It is to be understood that the invention can assume various alternative orientations and, accordingly, such terms are not to be considered as limiting. All numbers used in the specification and claims are to be understood as being modified in all instances by the term "about". All ranges disclosed herein are to be understood to encompass the beginning and ending range values and any and all subranges subsumed therein. The ranges set forth herein represent the average values over the specified range. All documents referred to herein are to be considered to be "incorporated by reference" in their entirety.

The term "film" refers to a region of a coating having a desired or selected composition. A "Layer" comprises one or more "films". A "coating" or "stack" comprises one or more "layers". The term "organic material" includes polymers as well as small molecule organic materials, such as those used to fabricate organic opto-electronic devices. The term "over" means "on or above". The terms "polymer" or "polymeric" include oligomers, homopolymers, copolymers, and terpolymers. The term "visible light" means electromagnetic energy having a wavelength in the range of 380 nm to 780 nm. The term "infrared radiation" means electromagnetic energy having a wavelength in the range of greater than 780 nm to 100,000 nm. The term "ultraviolet radiation" means electromagnetic energy having a wavelength in the range of 100 nm to less than 380 nm.

For purposes of the following discussion, the invention will be discussed with reference to a bottom-emitting OLED device. However, it is to be understood that the invention is not restricted to use with bottom-emitting OLED devices but could be practiced with top-emitting OLED devices and also with devices in other fields, for example, solar cells, such as photovoltaic thin film solar cells.

The invention comprises, consists of, or consists essentially of, the following aspects of the invention, in any combination. Various aspects of the invention are illustrated in separate drawing figures herein. However, it is to be understood that this is simply for ease of illustration and discussion. In the practice of the invention, one or more aspects of the invention shown in one drawing figure can be combined with one or more aspects of the invention shown in one or more of the other drawing figures.

A basic OLED device (OLED) 10 incorporating features of the invention is shown in FIG. 1. The OLED device 10 includes a first electrode (e.g., top electrode) 12, an active stack 14 incorporating an electroluminescent emissive layer 16, a second electrode (e.g., bottom electrode) 18, and a substrate 20. The substrate 20 has a first surface 22 (e.g., top surface) and a second surface 24 (e.g., bottom surface). The emissive layer 16 can include an electroluminescent emissive organic material.

For purposes of the following discussion, the OLED 10 will be described as a bottom-emitting OLED. The first electrode 12 will be considered the "cathode" and the second electrode 18 will be considered the "anode". However, this is simply for ease of describing the invention and should not be considered as limiting. The positions of the electrodes could be reversed, such as for a top-emitting OLED. The general structure and operation of a conventional OLED device will be well understood by one of ordinary skill in the art and, therefore, will not be described in detail.

In the practice of the invention and as described below, at least one of the first and second electrodes 12, 18 is a light extracting electrode 26 incorporating one or more aspects of the invention. The light extracting electrode 26 can be a single metallic layer 28 incorporating one or more light extracting features 29, described in more detail below. The light extracting electrode 26 also can be a multilayer structure incorporating the at least one metallic layer 28 and one or more optional layers, as described in more detail below.

In the following discussion, the light extracting electrode 26 will be described with respect to the second electrode 18 (for example, the anode). For ease of discussion, the light extracting electrode 26 (e.g., anode) will be referred to herein as an "electrode" (or "anode") regardless of whether the light extracting electrode 26 is a single metallic layer 28 or is a multilayer structure that includes the metallic layer 28 as well as one or more additional optional layers that are present for functions other than electron transport. Both of the first and second electrodes 12, 18 of the OLED can be transparent or one electrode can be transparent and the other electrode can be opaque (for example, reflective). For bottom emitting OLEDs, the second electrode 18 (closest to the substrate 20) is preferably transparent to the generated electromagnetic radiation.

As used herein, by "transparent" is meant having a transmittance of electromagnetic radiation at one or more desired wavelengths (for example, a visible light transmittance at a wavelength of 550 nanometers (nm)) of at least 50%, such as at least 60%, such as at least 70%, such as at least 80%, such as at least 90%, such as at least 95%. As used herein, by "opaque" is meant having a transmittance of electromagnetic radiation at one or more desired wavelengths (such as visible light at a wavelength of 550 nm) of less than 50%, such as less than 40%, such as less than 30%, such as less than 20%, such as less than 10%, such as less than 5%, such as 0%. As used herein, by "reflective" is meant that at least a portion of the electromagnetic energy generated by the active stack 14 is reflected by the electrode.

Examples of suitable materials for the cathode (e.g., the first electrode 12 in the illustrated example) include metals, such as barium, calcium, and magnesium. The cathode typically has a low work function. For OLEDs in which the light emission is only or is primarily out of the bottom of the device 10 (through the substrate side of the device 10), the first electrode 12 can be opaque and/or reflective. For example, the first electrode 12 can be reflective or at least partly reflective of at least a portion of the light generated by the active stack 14. The first electrode 12 can reflect at least 20%, such as at least 30%, such as at least 40%, such as at least 50%, such as at least 60%, such as at least 70%, such as at least 80%, such as at least 90%, of electromagnetic energy having a wavelength of 550 nm. The first electrode 12 can be a relatively thick reflective metal layer having high electrical conductivity. Alternatively, if it is desired that light be emitted out of the top of the device 10, the first electrode 12 can be transparent.

The active layer 14 can include any conventional emissive layer 16. Examples of materials suitable for the emissive layer 16 include small molecules, such as organometallic chelates (e.g., Alq$_3$), fluorescent and phosphorescent dyes, and conjugated dendrimers. Further examples of suitable materials include triphenylamine, perylene, rubrene, and quinacridones. Alternatively, electroluminescent polymeric materials can be used. Examples of conductive polymers include poly(p-phenylene vinylene) and polyfluorene. Phosphorescent materials could also be used. Examples of such materials include polymers, such as poly(n-vinylcarbazole), in which an organometallic complex, such as an iridium complex, is added as a dopant.

For bottom emitting OLEDs, the substrate 20 is preferably transparent. Examples of suitable materials for the substrate 20 include glass, such as conventional soda-lime silicate glass, for example, float glass. For applications such as lighting, the substrate 20 preferably has a high visible light transmission at a reference wavelength of 550 nanometers (nm) and a reference thickness of 3.2 mm. By "high visible light transmission" it is meant visible light transmission (at a reference wavelength of 550 nm and a reference thickness of 3.2 mm) of at least 85%, such as at least 87%, such as at least 90%, such as at least 91%, such as at least 92%, such as at least 93%, such as at least 95%.

Examples of glass that can be used for the invention include Starphire®, Solarphire®, Solarphire® PV, and CLEAR™ glass, all commercially available from PPG Industries, Inc. of Pittsburgh, Pa.

The substrate 20 can have any desired thickness, such as in the range of 0.5 mm to 10 mm, such as 1 mm to 10 mm, such as 1 mm to 4 mm, such as 2 mm to 3.2 mm.

As shown in FIG. 1, the light extracting electrode 26 can be, or can include, a metallic layer 28 having light scattering features 29 that increase the haze (i.e., light scattering) of the light extracting electrode 28.

Examples of materials suitable for the metallic layer 28 include metallic platinum, iridium, osmium, palladium, aluminum, gold, copper, silver, and/or mixtures and/or alloys thereof. In a preferred aspect, the metallic layer 28 is or includes metallic silver.

The light scattering features 29 are located in the metallic layer 28 and/or on a surface of the metallic layer 28. The light scattering features 29 are part of the metallic layer 28 or are incorporated into the metallic layer 28. The light scattering features 29 are not part of a separate coating or layer deposited on the metallic layer 28.

Examples of the light scattering features 29 include defects and/or dendrites. By "dendrite" or "dendrite-shaped" is meant a branching, treelike feature in or on the metallic layer 28. For example, the dendrite can be a crystal or crystalline mass. By "defect" is meant a spot and/or region and/or area in and/or on the metallic layer 28 that scatters electromagnetic radiation. Examples of defects include projections extending from a surface of the metallic layer, cracks or voids formed in and/or on the metallic layer 28, areas of different density in and/or on the metallic layer 28, and areas of different chemical composition in and/or on the metallic layer 28. The presence of the light scattering features 29 scatters electromagnetic energy and helps reduce the waveguide effect described above.

For example, the dendrites can have a diameter in the range of 10 microns to 50 microns, such as 10 microns to 40 microns, such as 20 microns to 40 microns, such as 30 microns to 40 microns. For example, the dendrites can have an average diameter in the range of 30 microns to 35 microns.

For example, the dendrites and/or defects can comprise projections extending upwardly from a surface, e.g., the upper surface 22, of the metallic layer 28. For example, at least some of the projections can have a height (with respect to the surface of the metallic layer 28) in the range of 10 nm to 80 nm, such as 20 nm to 60 nm, such as 30 nm to 60 nm, such as 30 nm to 50 nm. For example, at least some of the projections can have a height in the range of 30 nm to 50 nm.

For example, at least some of the projections can have a minimum height of 5 nm, such as 10 nm, such as 15 nm, such as 20 nm, such as 25 nm, such as 30 nm, such as 35 nm, such as 40 nm, such as 50 nm.

For example, at least some of the projections can have a maximum height of 100 nm, such as 90 nm, such as 80 nm, such as 70 nm, such as 50 nm, such as 55 nm, such as 50 nm, such as 45 nm, such as 40 nm.

Figure 2:
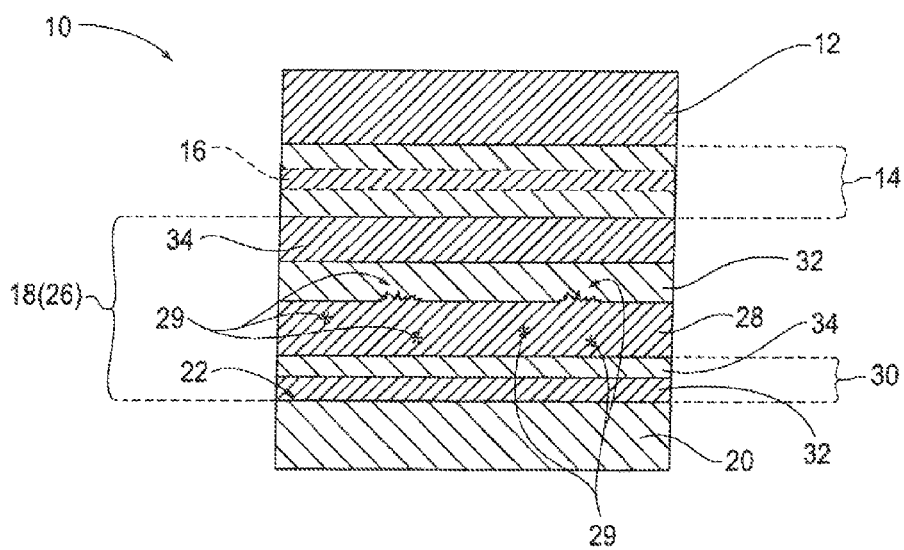
FIG. 2 is a side, sectional view of the OLED device of FIG. 1 incorporating additional optional layers.

FIG. 2 illustrates additional optional layers, one or more of which can be incorporated into the light extracting electrode 26. These additional optional layers will be described as part of the "electrode" even though one or more of the optional layers may be present for functions other than electron transport.

The light extracting electrode 26 can incorporate an optional underlayer 30 positioned between the metallic layer 28 and the top surface 22 of the substrate 20.

The underlayer 30 can be a homogeneous layer, a gradient layer, and/or can include a plurality of layers or films. By "homogeneous layer" is meant a layer in which the materials are randomly distributed throughout the coating. By "gradient layer" is meant a layer having two or more components, with the concentration of the components continually changing (or stepped) as the distance from the substrate changes.

The underlayer 30 can include one or more metal oxide materials. Examples of oxide materials suitable for the underlayer 30 include oxides of silicon, titanium, aluminum, zirconium, phosphorus, hafnium, niobium, zinc, bismuth, lead, indium, tin, and alloys and mixtures thereof.

For example, the underlayer 30 can comprise a mixture of at least silica and titania. For example, the underlayer 30 can comprise a mixture of silica, titania, and phosphorous oxide.

The underlayer 30 can have a minimum thickness of 10 nm, such as 15 nm, such as 20 nm, such as 25 nm, such as 30 nm, such as 35 nm, such as 40 nm, such as 45 nm, such as 50 nm, such as 55 nm, such as 60 nm, such as 65 nm, such as 70 nm, such as 80 nm, such as 90 nm, such as 100 nm, such as 110 nm, such as 115 nm.

The underlayer 30 can have a maximum thickness of 120 nm, such as 115 nm, such as 110 nm, such as 105 nm, such as 100 nm, such as 95 nm, such as 90 nm, such as 85 nm, such as 80 nm, such as 75 nm, such as 70 nm, such as 65 nm, such as 60 nm, such as 55 nm, such as 50 nm, such as 45 nm, such as 40 nm, such as 30 nm, such as 25 nm, such as 20 nm.

In a preferred aspect, the underlayer 30 has a thickness in the range of 10 nm to 120 nm, such as 30 nm to 80 nm, preferably 30 nm to 80 nm, more preferably 30 nm to 70 nm.

The underlayer 30 can include a zinc-containing layer, such as an oxide incorporating zinc. Examples of suitable zinc-containing layers include a zinc oxide layer, a layer comprising a combination of zinc and tin, a zinc alloy oxide layer, a zinc-tin alloy oxide layer, a zinc stannate layer, and Zn$_2$SnO$_4$. For example, the zinc-containing layer can comprise at least one of a zinc oxide layer and a zinc stannate layer.

The zinc-containing layer can be deposited from a zinc target that includes one or more other materials to improve the sputtering characteristics of the target, such as to increase the conductivity of the zinc target. For example, the zinc target can include a small amount (e.g., up to 10 wt. %, such as up to 5 wt. %) of a material to improve sputtering. In which case, the resultant zinc oxide layer would include a small percentage of an oxide of the added material, e.g., up to 10 wt. % of the material oxide, e.g., up to 5 wt. % of the material oxide. A layer deposited from a zinc target having up to 10 wt. % of an additional material to enhance the sputtering characteristics of the zinc target is referred to herein as "a zinc oxide layer" even though a small amount of the added material (e.g., material oxide) may be present.

Examples of materials that can be added to the zinc target to improve sputtering include conductive metals. For example, the added material can be selected from Fe, Mn, Al, Ce, Sn, Sb, Hf, Zr, Ni, Bi, Ti, Co, Cr, Si, and combinations thereof.

In a preferred aspect, the added material is tin. The small amount of tin in the zinc target (e.g., less than or equal to 10 wt. %, such as less than or equal to 5 wt. %) is believed to form tin oxide in the predominantly zinc oxide layer. As discussed above, such a layer will be referred to as a "zinc oxide" layer.

The underlayer 30 can include or can be a zinc stannate layer. By "zinc stannate" is meant a composition of the formula: $Zn_xSn_{1-x}O_{2-x}$ (Formula 1) where "x" varies in the range of greater than 0 to less than 1. For instance, "x" can be greater than 0 and can be any fraction or decimal between greater than 0 to less than 1. A zinc stannate layer has one or more of the forms of Formula 1 in a predominant amount.

In a preferred aspect of the invention, x=⅔. A zinc stannate layer in which x=⅔ is conventionally referred to as "$Zn_2SnO_4$".

The underlayer 30 can be a multilayer structure having a first layer 32 deposited over at least a portion of the top surface 22 of the substrate 12 and a second layer 34 deposited over the first layer 32. For example, the first layer 32 can be a metal alloy oxide film and the second layer 34 can be a metal oxide or oxide mixture layer. For example, the first layer 32 can be a zinc/tin alloy oxide. By "zinc/tin alloy oxide" is meant both true alloys and also mixtures of the oxides. One suitable metal alloy oxide material is zinc stannate. In a preferred aspect, the zinc stannate is $Zn_2SnO_4$.

The second layer 34 can be a metal oxide layer, such as zinc oxide (with or without the tin oxide as described above). In a preferred aspect, the first layer 32 is a zinc stannate layer and the second layer 34 is a zinc oxide layer. In a more preferred aspect, the first layer 32 is $Zn_2SnO_4$ and the second layer 34 is zinc oxide (with up to 10 wt. % tin oxide, such as up to 5 wt. % tin oxide).

The first layer 32 can have a minimum thickness of 5 nm, such as 10 nm, such as 15 nm, such as 20 nm, such as 25 nm, such as 30 nm, such as 35 nm, such as 40 nm, such as 45 nm, such as 50 nm, such as 55 nm.

The first layer 32 can have a maximum thickness of 60 nm, such as 55 nm, such as 50 nm, such as 45 nm, such as 40 nm, such as 35 nm, such as 30 nm, such as 25 nm, such as 20 nm, such as 15 nm, such as 10 nm.

In a preferred aspect, the first layer 32 has a thickness in the range of 5 nm to 60, such as 5 nm to 50 nm, such as 7.5 nm to 35 nm, such as 10 nm to 25 nm, such as 15 nm to 25 nm, such as 19.5 nm to 25 nm, such as 20 nm to 25 nm, such as 20 nm to 22 nm.

The second layer 34 can have a minimum thickness of 5 nm, such as 8 nm, such as 10 nm, such as 12 nm, such as 14 nm, such as 16 nm, such as 18 nm.

The second layer 34 can have a maximum thickness of 20 nm, such as 18 nm, such as 18 nm, such as 14 nm, such as 12 nm, such as 10 nm, such as 8 nm, such as 6 nm.

In a preferred aspect, the second layer 34 has a thickness in the range of 5 nm to 20 nm, such as 7.5 nm to 20 nm, such as 10 nm to 15 nm, such as 10 nm to 11 nm.

An optional primer layer 36 can be provided over the metallic layer 28. The primer layer 38 can be a single film or a multiple film layer. The primer layer 38 can include an oxygen-capturing material that can be sacrificial during the deposition process to control degradation or oxidation of the metallic layer 28 during the sputtering process or during subsequent heating processes. Examples of materials useful for the primer layer 38 include titanium, silicon, silicon dioxide, silicon nitride, silicon oxynitride, nickel-chrome alloys (such as Inconel), zirconium, aluminum, alloys of silicon and aluminum, alloys containing cobalt and chromium (e.g., Stellite®), and mixtures thereof.

For example, the primer layer 36 can be or can include titanium.

The primer layer 36 can have a thickness in the range of 0.5 nm to 5 nm, e.g., 0.5 nm to 3 nm, e.g., 0.5 nm to 1 nm, e.g., 0.5 nm to 0.6 nm.

An optional top layer 38 can be provided over the primer layer 36 (if present) or over the metallic layer 28 (if the primer layer 36 is not present). The top layer 38 can be a protective layer to provide mechanical or chemical durability to the underlying layers.

The top layer 38 can include one or more metal oxides, silicon oxides, aluminum oxides, aluminosilicates, silicon nitrides, silicon carbides, and silicon oxycarbides. Examples of materials suitable for the top layer 38 include oxides of one or more of zirconium, zinc, tin, aluminum, silicon, and mixtures and/or alloys thereof. For example, the top layer 38 can include zinc and tin. For example, the top layer 38 can be a mixture of zinc oxide and tin oxide and/or an alloy of zinc and tin, such as zinc stannate.

For example, the top layer 38 can be a single coating layer comprising 0 wt. % to 100 wt. % alumina and/or 0 wt. % to 100 wt. % silica and/or 0 wt. % to 100 wt. % zirconium oxide. For example, the top layer 38 can include silica and alumina having, for example, 1 wt. % to 99 wt. % silica and 99 wt. % to 1 wt. % alumina, such as at least 40 wt. % silica and 60 wt. % or less alumina, such as at least 70 wt. % silica and 30 wt. % or less alumina, such as at least 75 wt. % silica, such as at least 80 wt. % silica, such as at least 85 wt. % silica. In one non-limiting aspect, the top layer 38 comprises 85 wt. % silica and 15 wt. % alumina. In another non-limiting aspect, the top layer 38 comprises 40 wt. % silica and 60 wt. % alumina. In a further non-limiting aspect, the top layer 38 includes a mixture of silica and alumina.

The top layer 38 can have a minimum thickness of 0.5 nm, such as 0.6 nm, such as 1 nm, such as 2 nm, such as 5 nm, such as 10 nm, such as 20 nm, such as 30 nm, such as 40 nm, such as 50 nm, such as 60 nm, such as 70 nm, such as 75 nm, such as 100 nm, such as 110 nm, such as 120 nm, such as 150 nm, such as 200 nm, such as 250 nm, such as 300 nm, such as 500 nm, such as 700 nm, such as 1,000 nm, such as 2,000 nm, such as 3,000 nm.

The top layer 38 can have a maximum thickness of 5,000 nm, such as 3,000 nm, such as 2,000 nm, such as 1,000 nm, such as 500 nm, such as 300 nm, such as 200 nm, such as 150 nm, such as 100 nm, such as 90 nm, such as 80 nm.

In a preferred aspect, the top layer 38 has a thickness in the range of 0.5 nm to 5,000 nm, such as 0.5 nm to 3,000 nm, such as 0.5 nm to 2,000 nm, such as 0.5 nm to 1,000 nm, such as 1 nm to 500 nm, such as 2 nm to 300 nm, such as 5 nm to 300 nm, e.g., 50 nm to 200 nm, such as 50 nm to 150 nm, such as 50 nm to 120 nm, such as 60 nm to 120 nm, such as 70 nm to 120 nm, such as 70 nm to 100 nm, such as 70 nm to 80 nm.

In an alternative aspect of the invention, the top layer 38 comprises a silica/alumina mixture having at least 40 wt. % silica, such as at least 50 wt. % silica, such as at least 60 wt. % silica, such as at least 70 wt. % silica, such as at least 80 wt. % silica, such as in the range of 80 wt. % to 90 wt. % silica and 10 wt. % to 20 wt. % alumina, e.g., 85 wt. % silica and 15 wt. % alumina. In this non-limiting aspect, the top layer 38 can have a thickness in the range of greater than 0 nm to 2 microns, such as 0.5 nm to 500 nm, such as 5 nm to 200 nm, such as 10 nm to 100 nm, such as 30 nm to 50 nm, such as 35 nm to 40 nm. In another non-limiting aspect, the top layer 38 can have a thickness in the range of greater than 0 nm to 1 micron, such as 0.5 nm to 10 nm, such as 10 nm to 25 nm, such as 10 nm to 15 nm.

The optional underlayer 30, metallic layer 28, optional primer 36, and optional top layer 38 can be deposited by any conventional method, such as, conventional chemical vapor deposition (CVD) and/or physical vapor deposition (PVD) methods. Examples of CVD processes include spray pyrolysis. Examples of PVD processes include electron beam evaporation and vacuum sputtering (such as magnetron sputter vapor deposition (MSVD)). Other coating methods could also be used, such as sol-gel deposition. The layers can be deposited by the same or differing methods.

In an optional aspect, the top layer 38 can be a conductive layer. Examples of suitable conductive materials include conductive oxides, such as conductive metal oxides.

Particular examples of conductive oxides include indium tin oxide (ITO), aluminum zinc oxide (AZO), or indium zinc oxide (IZO). The conductive properties of the top layer 34 may be beneficial in reducing the driving voltage for the OLED 10.

The light extracting electrode 26 (or metallic layer 28) can have a minimum sheet resistance of 1 ohm per square (Ω/□), such as 2Ω/□, such as 4Ω/□, such as 5Ω/□, such as 5.5Ω/□, such as 6Ω/□, such as 6.5Ω/□, such as 7Ω/□, such as 8Ω/□, such as 9Ω/□, such as 10Ω/□, such as 12Ω/□, such as 13Ω/□, such as 15Ω/□, such as 17Ω/□, such as 18Ω/□, such as 20Ω/□, such as 25Ω/□, such as 30Ω/□, such as 32Ω/□, such as 34Ω/□, such as 36Ω/□, such as 40Ω/□, such as 50Ω/□, such as 55Ω/□, such as 60 Ω/□.

The light extracting electrode 26 (or metallic layer 28) can have a maximum sheet resistance of 210Ω/□, such as 200Ω/□, such as 175Ω/□, such as 150Ω/□, such as 125Ω/□, such as 100Ω/□, such as 75Ω/□, such as 50Ω/□, such as 30Ω/□, such as 20Ω/□, such as 15Ω/□, such as 13Ω/□, such as 10Ω/□, such as 8 Ω/□.

In a preferred aspect, the light extracting electrode 26 (or metallic layer 28) has a sheet resistance in the range of 1Ω/□ to 20Ω/□, such as 1Ω/□ to 15Ω/□, such as 1Ω/□ to 10Ω/□, such as 1Ω/□ to 8Ω/□, such as 2Ω/□ to 8Ω/□, such as 4Ω/□ to 8 Ω/□.

The light extracting electrode 26 can have a minimum visible light transmittance (at a thickness of 2 mm) of 50%, such as 60%, such as 65%, such as 70%, such as 75%, such as 78%, such as 80%, such as 83%, such as 85%, such as 90%, such as 91%, such as 92%, such as 93%, such as 95%.

The light extracting electrode 26 can have a maximum visible light transmittance (at a thickness of 2 mm) of 99%, such as 97%, such as 96%, such as 95%, such as 93%, such as 92%, such as 91%, such as 90%, such as 85%, such as 80%, such as 70%, such as 60%.

In a preferred aspect, the light extracting electrode 26 has a visible light transmittance (at a thickness of 2 mm) in the range of 50% to 97%, such as 70% to 95%, such as 75% to 95%, such as 80% to 95%, such as 85% to 95%, such as 88% to 95%, such as 90% to 95%.

The light extracting electrode 26 can have a minimum haze of 0.04%, such as 0.05%, such as 0.07%, such as 0.08%, such as 0.1%, such as 0.12%, such as 0.15%, such as 0.2%, such as 0.3%, such as 0.5%, such as 0.8%, such as 1%, such as 1.5%, such as 2%, such as 3%, such as 4%, such as 5%, such as 6%, such as 7%, such as 8%, such as 9%, such as 10%, such as 12%, such as 15%.

The light extracting electrode 26 can have a maximum haze of 20%, such as 15%, such as 12%, such as 10%, such as 9%, such as 8%, such as 7%, such as 6%, such as 5%, such as 4%, such as 3%, such as 2%, such as 1%.

In a preferred aspect, the light extracting electrode 26 has haze in the range of 0.5% to 10%, such as 1% to 10%, such as 1% to 8%.

The light extracting electrode 26 can have a minimum root mean square (RMS) surface roughness of 5 nm, such as 6 nm, such as 8 nm, such as 10 nm, such as 15 nm, such as 20 nm, such as 25 nm, such as 30 nm, such as 35 nm, such as 40 nm, such as 45 nm, such as 47 nm, such as 50 nm, such as 52 nm, such as 54 nm, such as 55 nm.

The light extracting electrode 26 can have a maximum root mean square surface roughness of 60 nm, such as 55 nm, such as 54 nm, such as 50 nm, such as 47 nm, such as 45 nm, such as 40 nm, such as 35 nm, such as 25 nm, such as 20 nm, such as 15 nm, such as 10 nm.

In a preferred aspect, the light extracting electrode 26 has a root mean square surface roughness in the range of 5 nm to 60 nm, such as 25 nm to 60 nm, such as 40 nm to 60 nm, such as 50 nm to 60 nm.

The light scattering features 29 of the metallic layer 28 can be provided by several methods.

For example, after the metallic layer 28 is formed on the substrate 20, the metallic layer 28 can be exposed to oxygen. For many metals, the metal reacts with oxygen to oxidize to form defects in or on the metal. For example, this exposure to oxygen can occur during the process to form the optional top layer 38 over the metallic layer 28 or as a separate step.

For example, the metallic layer 28 can be exposed to oxygen (such as to the ambient atmosphere) for a period of time in the range of 1 minute to 20 minutes, such as 1 minute to ten minutes, such as 1 minute to 5 minutes, such as 3 minutes to 5 minutes, such as 3 minutes to 4.5 minutes.

Another exemplary method to form light-scattering features 29 (e.g., haze-inducing defects) in the metallic layer 28 is by post heating. By "post-heating" is meant heating the substrate 12 and metallic layer 28 after deposition of the metallic layer 28. Post heating, either with or without exposure to oxygen, tends to oxidize the metal of the metallic layer 28 to form defects in or on the metallic layer and/or increase the haze of the metallic layer 28.

For example, the metallic layer 28 can be heated to a temperature in the range of 400° C. to 1000° C., such as 500° C. to 900° C., such as 600° C. to 800° C., such as 700° C. to 800° C., such as 700° C. to 750° C.

The metallic layer 28 can be heated for a period of time in the range of 1 minute to 20 minutes, such as 1 minute to ten minutes, such as 1 minute to 5 minutes, such as 3 minutes to 5 minutes, such as 3 minutes to 4.5 minutes.

The heating can be conducted in a conventional oven or in a conveyor oven. For example, the conveyor oven can have a conveyor line speed in the range of 2.5 cm/min to 51 cm/min, such 5 cm/min to 38 cm/min, such as 5 cm/min to 28 cm/min, such as 5 cm/min to 20 cm/min, such as 10 cm/min to 20 cm/min.

The conveyor oven can have one or multiple heating chambers. For example, one or more of the heating chambers can have a temperature in the range of 400° C. to 1000° C., such as 500° C. to 800° C., such as 500° C. to 700° C., such as 500° C. to 650° C., such as 525° C. to 625° C. The heating chambers can have the same or different temperatures.

Another exemplary method to induce the light-scattering features 29 is to expose the metallic layer 28 to a laser beam to form defects in the metallic layer 28. For example, this can be done prior to the application of the optional top layer 38. The defects can be cracks or voids formed in and/or on the metallic layer 28 by the laser. The defects can also be areas of different density caused by focusing the laser to a position on the surface or in the interior of the metallic layer 28.

A further exemplary way to induce these light-scattering features 29 is by exposing the metallic layer 28 to an oxygen plasma treatment. The oxygen plasma causes protrusions on the surface of the metallic layer 28.

A still further exemplary way of inducing light-scattering features 29 is by doping the metallic layer 28 with dopants that produce defects or otherwise increase the haze of the metallic layer 28. Examples of such dopants include copper, aluminum, and zinc. The dopant can react with or combine with or mix with the metal of the metallic layer 28 to form spots or areas having a different density and/or different composition than the rest of the metallic layer 28.

It is to be understood that all of the optional layers discussed above need not be present in the OLED 10. One or more of these optional layers can be provided as desired based on such considerations as cost, ease of manufacture, and desired end use of the OLED 10.

Operation of the OLED device 10 will now be described with particular reference to FIG. 1.

During operation, a voltage is applied across the first electrode 12 and the second electrode 18. A current of electrons flows from the cathode (e.g., first electrode 12) to the anode (e.g., second electrode 18) and, thus, through the emissive layer 16 (and the optional layers, if present). This electric current causes the emissive layer 16 to emit electromagnetic radiation (e.g., light) of a selected wavelength or range of wavelengths, depending upon the composition of the emissive layer 16. The light waves emitted by the emissive layer 16 travel into the metallic layer 28 of the second electrode 18. In a conventional OLED device, the majority of the electromagnetic radiation entering the second electrode 18 would be trapped by the waveguide effect. However, in the invention, at least a portion of this electromagnetic energy is scattered by the light scattering features 29. This scattering causes the light waves to travel more randomly and disrupts the waveguide effect, increasing the amount of electromagnetic energy that passes through the metallic layer 28, into the substrate 20, and then exits the bottom surface 24. The light scattering effect caused by the light scattering features 29 of the metallic layer 28 increases the overall light extraction for the OLED device 10.

The following Examples illustrate various aspects of the invention. However, it is to be understood that the invention is not limited to these specific aspects.

EXAMPLES

In the following examples, the substrates were clear glass commercially available from PPG Industries Ohio, Inc. having a thickness of 2 millimeters (mm). The visible light transmittance (T) values and haze (Haze) values are percentage values and were measured using a Haze-Gard Plus hazemeter commercially available from BYK-Gardner USA. The coating layers were applied using a conventional Airco MSVD coater having a target width of 5 inches and a line speed of 60 inches per minute. "Zn90" means to a target having 90 wt. % zinc and 10 wt. % tin. "Al60" means a target having 60 wt. % aluminum and 40 wt. % silicon. "SnZn" means a target having 52.4 wt. % zinc and 47.6 wt. % tin (to deposit a $Zn_2SnO_4$ layer). All coater power settings are in kilowatts (Kw). All time values are in minutes. The sheet resistance values are in ohms per square ($\Omega/\square$). "O/R" means the value was out of measurement range. A "—" symbol means that the value was not measured, "M" means Mega Ohms. For the following Examples, replicates of substrates coated with particular coating layers are designated with a small letter after the coating number. For example, Samples 1a, 1b, 1c, 1d, etc. designate replicate glass substrates coated with coating 1. Physical characteristics, such as height of the projections, surface roughness, and diameter of the dendrites, were determined by conventional atomic force microscopy (AFM).

Example 1

This Example illustrates a light scattering electrode structure having an underlayer of zinc oxide (with 10 wt. % tin oxide)/a metallic silver conductive layer/a top layer (protective layer) of 60 wt. % alumina and 40 wt. % silica.

Table 1 lists the caster power settings during deposition. Substrates were subjected to one pass under each target.

TABLE 1

| Coating # | Zn90 | Ag   | Al60 | T    | Haze |
|-----------|------|------|------|------|------|
| 1         | 5    | 2    | 50   | 64.7 | 0.23 |
| 2         | 5    | 1.5  | 50   | 72.5 | 0.16 |
| 3         | 5    | 1    | 50   | 76.7 | 0.09 |
| 4         | 5    | 0.5  | 50   | 79.9 | 0.1  |
| 5         | 5    | 0.25 | 50   | 87.7 | 0.08 |

The coated substrates were measured for sheet resistance before heating (Pre-Heat) and then heated in a box oven at 1300° F. (704° C.) for the times listed in Table 2. After heating, the coated substrates were allowed to cool to room temperature and then sheet resistance, transmittance, and haze were again measured (Post-Heat). The resultant values are shown in Table 2.

TABLE 2

| Sample | Time | Sheet Resistance | | Post-Heat | |
|--------|------|------------------|-----------|------|------|
|        |      | Pre-Heat | Post-Heat | T    | Haze |
| 1a     | 3    | 15       | 6.5       | 73.4 | 4.69 |
| 1b     | 3.5  | 13.5     | 5.5       | 70.2 | 7.41 |
| 1c     | 4    | 14.4     | 5.7       | 68.9 | 8.71 |
| 1d     | 4.5  | —        | 7.1       | 69.5 | 8.27 |
| 1e     | 5    | —        | 6.2       | 66.7 | 9.2  |
| 2a     | 3    | 23.2     | 13        | 78.9 | 4.88 |
| 2b     | 3.5  | 23.6     | 13        | 77.6 | 6.7  |
| 2c     | 4    | 24.7     | 17.7      | 77.4 | 7.58 |
| 3a     | 3    | 65.5     | 223       | 79.9 | 2.46 |

TABLE 2-continued

| Sample | Time | Sheet Resistance | | Post-Heat | |
| | | Pre-Heat | Post-Heat | T | Haze |
| --- | --- | --- | --- | --- | --- |
| 3b | 3.5 | 61.4 | 202 | 78.6 | 3.21 |
| 3c | 4 | 61.7 | 206 | 75.5 | 3.62 |
| 4a | 3 | O/R | O/R | 85 | 0.42 |
| 4b | 3.5 | O/R | O/R | 87.1 | 0.44 |
| 4c | 4 | O/R | O/R | 91 | 0.2 |
| 5a | 3 | 0.6M | O/R | 92.6 | 0.07 |
| 5b | 3.5 | 10M | O/R | 92.8 | 0.23 |
| 6c | 4 | 14M | O/R | 92.5 | 0.6 |

Figure 3:
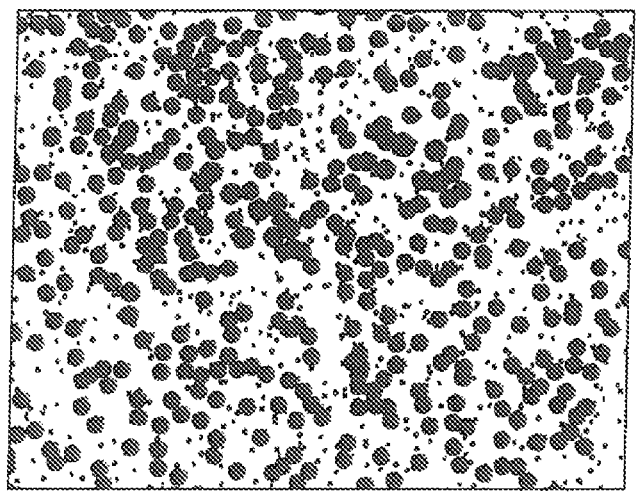
FIG. 3 is a micrograph of Sample 1c (of Example 1) after heating.
Figure 4:
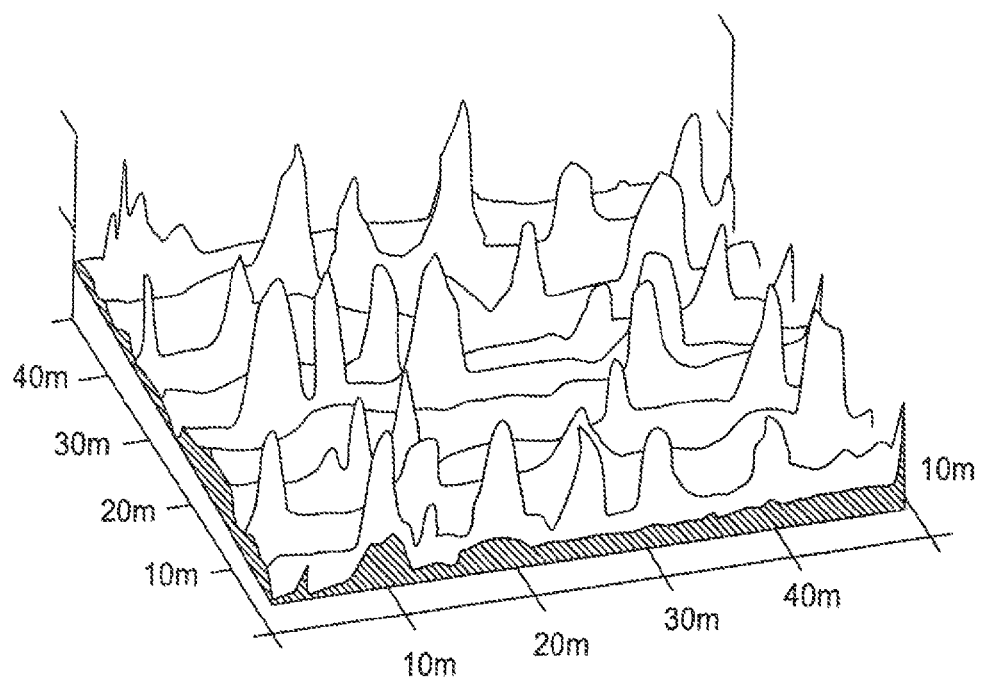
FIG. 4 is a three-dimensional atomic force micrograph (50 microns by 50 microns) for the Sample 1c of FIG. 3.
Figure 5:
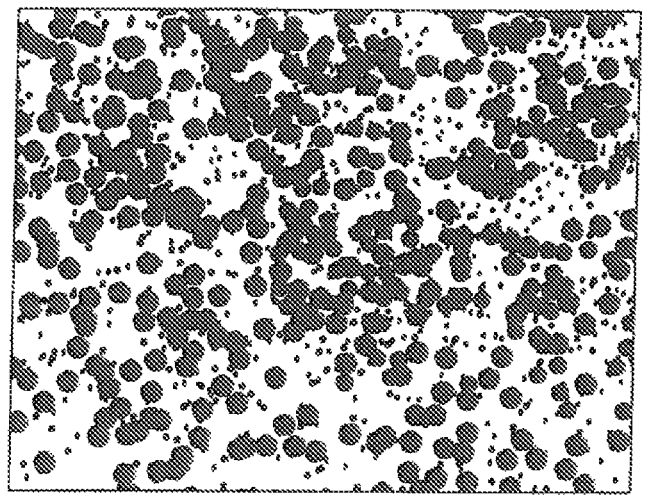
FIG. 5 is a micrograph of the Sample 1c of FIG. 3 after three months.
Figure 6:
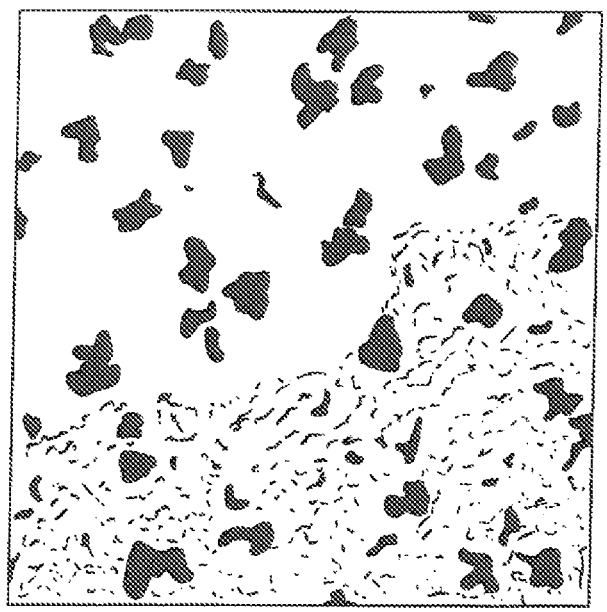
FIG. 6 is a two-dimensional atomic force micrograph (50 microns by 50 microns) of the Sample 1c of FIG. 5.

FIG. 3 is a micrograph of Sample 1c (Post-Heat) showing the defects in/on the metallic layer. FIG. 4 is a three-dimensional atomic force micrograph (50 microns by 50 microns) for the Sample 1c of FIG. 3. As can be seen, the metallic layer had defects (projections or spot defects) extending upwardly from the surface of the metallic layer. At least some of the defects had a height of 50 nm. For Sample 1c shown in FIGS. 3 and 4, the Pre-Heat sample had a root mean square (RMS) surface roughness of 0.64 nm. Post-Heating, the sample had a RMS roughness of 3.97 between the defects and a RMS surface roughness of 47.6 nm including the defects. A replicate Sample 1c was measured after three months. FIG. 5 is a micrograph of the replicate Sample 1c after three months. FIG. 6 is a two-dimensional atomic force micrograph (50 microns by 50 microns) of the replicate Sample 1c of FIG. 5. The replicate Sample 1c had a Pre-Heat root mean square (RMS) surface roughness of 0.69 nm and a Post-Heat RMS surface roughness of 57.3 nm. After three months, the Sample 1c had a sheet resistance of 80 Ω/□.

Example 2

This Example illustrates a light emitting electrode structure having an underlayer of zinc oxide (with 10 wt. % tin oxide)/a metallic silver layer/a top layer (conductive layer) of zinc doped indium oxide (IZO).

Table 3 lists the coater power settings during deposition of the listed targets. Substrates were coated with Zn90 and Ag for 1 pass and with IZO for 2 passes.

TABLE 3

| Coating # | Zn90 | Ag | IZO | T | Haze |
| --- | --- | --- | --- | --- | --- |
| 7 | 5 | 2 | 5 | 82.6 | 0.09 |
| 8 | 5 | 2.5 | 5 | 86.3 | 0.1 |
| 9 | 5 | 1 | 5 | 86.3 | 0.07 |
| 10 | 5 | 0.5 | 5 | 75.1 | 0.14 |
| 11 | 5 | 0.25 | 5 | 73.2 | 0.14 |

The coated substrates were measured for sheet resistance before heating (Pre-Heat) and then heated in a box oven at 1300° F. (704° C.) for the times listed in Table 4. After heating, the coated substrates were allowed to cool to room temperature and then sheet resistance, transmittance, and haze were again measured (Post-Heat). The resultant values are shown in Table 4.

TABLE 4

| Sample | Time | Sheet Resistance | | Post-Heat | |
| | | Pre-Heat | Post-Heat | T | Haze |
| --- | --- | --- | --- | --- | --- |
| 7a | 3 | 4.2 | 5.6 | 83.3 | 1.47 |
| 7b | 3.5 | 4.4 | 8.4 | 83.1 | 2.07 |

TABLE 4-continued

| Sample | Time | Sheet Resistance | | Post-Heat | |
| | | Pre-Heat | Post-Heat | T | Haze |
| --- | --- | --- | --- | --- | --- |
| 7c | 4 | 4 | 8.4 | 82.3 | 2.41 |
| 7d | 4.5 | — | 11.8 | 80 | 2.96 |
| 8a | 3 | 5.7 | 8.6 | 85 | 0.98 |
| 8b | 3.5 | 5.7 | 10-12 | 84.5 | 1.3 |
| 8c | 4 | 5.7 | 18-20 | 83.2 | 2.12 |
| 9a | 3 | 9.3 | 32-36 | 82.9 | 0.87 |
| 9b | 3.5 | 9.6 | 52-56 | 82.2 | 1.13 |
| 9c | 4 | 10 | 170-220 | 78 | 2.23 |
| 10a | 3 | 43 | 0.5M | 78.1 | 0.62 |
| 10b | 3.5 | 40.5 | 0.2M | 78.6 | 0.25 |
| 10c | 4 | 36 | 0.5M | 78.3 | 0.38 |
| 11a | 3 | 119 | 0.7M | 77.4 | 0.37 |
| 11b | 3.5 | 116.5 | 0.73M | 79.3 | 1.15 |
| 11c | 4 | 112 | 0.76M | 78.9 | 2.61 |

Figure 7:
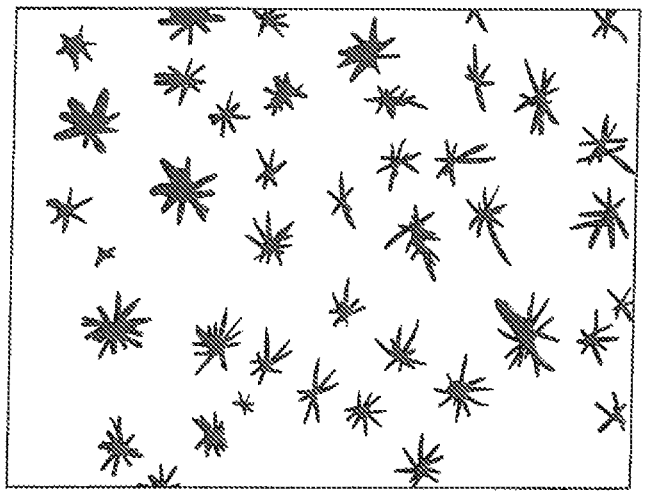
FIG. 7 is a micrograph of Sample 7c (from Example 2) after heating.
Figure 8:
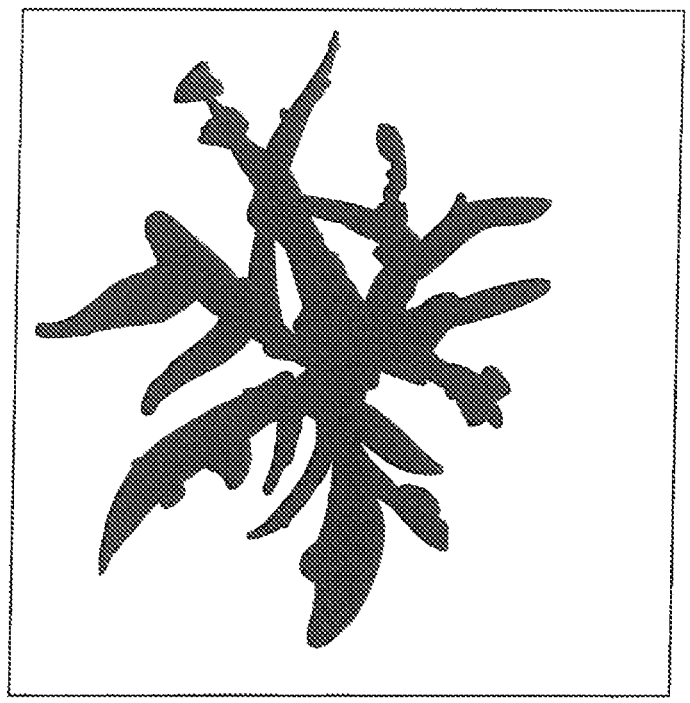
FIG. 8 is a two-dimensional atomic force micrograph (50 microns by 50 microns) of the Sample 7c of FIG. 7.
Figure 9:
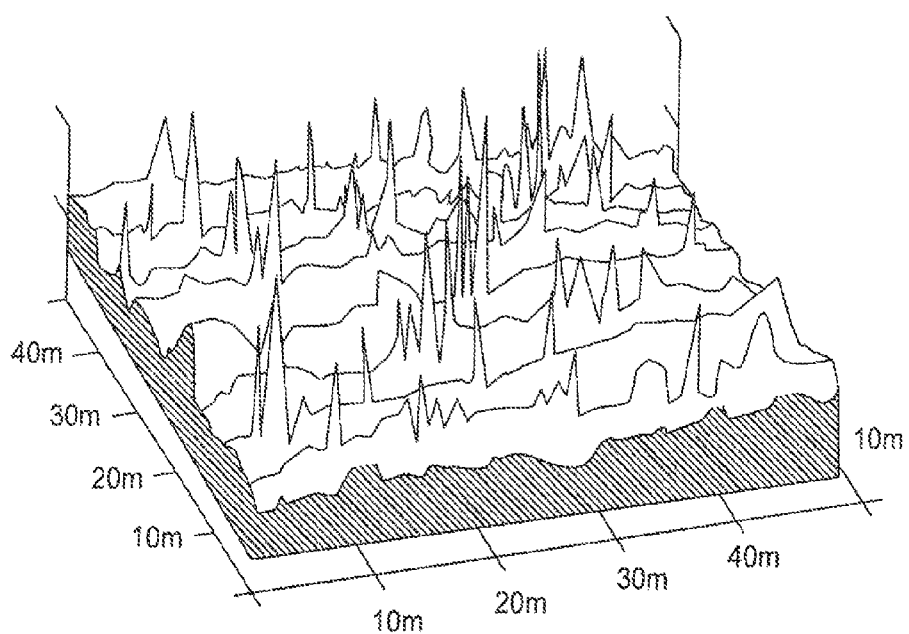
FIG. 9 is a three-dimensional atomic force micrograph (50 microns by 50 microns) for the Sample 7c of FIG. 7.

FIG. 7 is a micrograph of Sample 7c after heating. FIG. 8 is a two-dimensional atomic force micrograph (50 microns by 50 microns) of Sample 7c of FIG. 7. FIG. 9 is a three-dimensional atomic force micrograph (50 microns by 50 microns) for Sample 7c of FIG. 8. The defects were shaped as dendrites having branches. The dendrites had projections extending upwardly therefrom. At least some of the projections had a height of 40 nm. Sample 7c had a Pre-Heat root mean square (RMS) surface roughness of 0.64 nm. Post-Heating, the Sample 7c had a RMS roughness of 3.64 between the defects and a RMS surface roughness of 6.92 nm including the defects.

Example 3

This Example illustrates an anode structure having an underlayer of zinc stannate ($Zn_2SnO_4$)/a metallic silver layer/a titanium primer layer/a top layer (protective layer) of zinc stannate ($Zn_2SnO_4$).

Table 5 lists the coater power settings during deposition of the listed targets. Substrates were coated with Ag and Ti for 1 pass and with zinc stannate for 4 passes (for both the underlayer and the top layer).

TABLE 5

| Coating # | SnZn | Ag | Ti | SnZn | T | Haze |
| --- | --- | --- | --- | --- | --- | --- |
| 12 | 10 | 2 | 1.44 | 10 | 88.6 | 0.08 |
| 13 | 10 | 2.5 | 1.44 | 10 | 88.8 | 0.08 |
| 14 | 10 | 1 | 1.44 | 10 | 85.9 | 0.12 |
| 15 | 10 | 0.5 | 1.44 | 10 | 74.7 | 0.19 |
| 16 | 10 | 0.25 | 1.44 | 10 | 77.6 | 0.2 |
| 17 | 10 | 2 | 0 | 10 | 70.9 | 0.22 |

The coated substrates were measured for sheet resistance (Pre-Heat) and then heated in a box oven at 1300° F. (704° C.) for the times listed in Table 6. After heating, the coated substrates were allowed to cool to room temperature and then sheet resistance, transmittance, and haze were again measured (Post-Heat). The resultant values are shown in Table 6.

TABLE 6

| Sample | Time | Sheet Resistance | | Post-Heat | |
| | | Pre-Heat | Post-Heat | T | Haze |
| --- | --- | --- | --- | --- | --- |
| 12a | 3 | 5.6 | 4.4 | 90.3 | 0.08 |
| 12b | 3.5 | 6.1 | 4.9 | 90.3 | 0.07 |
| 12c | 4 | 5.8 | 4.9 | 89.9 | 0.08 |
| 12d | 5 | — | 4.9 | 89 | 0.15 |

TABLE 6-continued

| Sample | Time | Sheet Resistance Pre-Heat | Sheet Resistance Post-Heat | Post-Heat T | Post-Heat Haze |
|---|---|---|---|---|---|
| 12e | 5.5 | — | 5.5 | 88.4 | 0.32 |
| 13 | 3 | 9.1 | 8.2 | 89.6 | 0.09 |
| 14 | 3.5 | 8.9 | 7.5 | 90 | 0.12 |
| 13c | 4 | 8.4 | 7.9 | 89.3 | 0.09 |
| 13d | 5 | — | 9.65 | 87 | 0.09 |
| 13e | 5.5 | — | 9.5 | 86.3 | 0.21 |
| 15 | 3 | 16.5 | 18 | 85.7 | 0.13 |
| 16 | 3.5 | 15.8 | 17 | 85.8 | 0.17 |
| 14c | 4 | 17.5 | 20.9 | 84 | 0.32 |
| 17 | 3 | O/R | O/R | 79.7 | 0.16 |
| 18 | 3.5 | O/R | O/R | 78.9 | 0.05 |
| 19 | 4 | O/R | O/R | 78.6 | 0.06 |
| 16a | 3 | O/R | O/R | 79.5 | 0.13 |
| 16b | 3.5 | O/R | O/R | 79.2 | 0.07 |
| 16c | 4 | O/R | O/R | 79 | 0.04 |
| 17a | 3 | O/R | O/R | 81.3 | 0.14 |
| 17b | 3.5 | O/R | O/R | 80.2 | 0.06 |
| 17c | 4 | O/R | O/R | 79.6 | 0.04 |

Example 4

This Example illustrates the use of a belt conveyor furnace rather than a box furnace for sample heating. Replicates of selected coating samples were heated in a conventional Lindberg furnace having five heating zones. Zone 1 had a temperature of 1130° F. (610° C.); zone 2 had a temperature of 1155° F. (624° C.); zone 3 had a temperature of 1155° F. (624° C.); zone 4 had a temperature of 1155° F. (624° C.); and zone 5 had a temperature of 1000° F. (538° C.). The Pre-Heat values for glass substrates with the listed coatings are shown in Table 7.

TABLE 7

| Coating | T | Haze | Sheet Resistance |
|---|---|---|---|
| 2 | 72.1 | 0.16 | 23.5 |
| 7 | 82.3 | 0.09 | 4.25 |
| 8 | 86 | 0.08 | 6.09 |
| 13 | 88.7 | 0.05 | 9.5 |

The samples of the coated glass substrates were then heated in the Lindberg furnace at the conveyor line speeds shown in Table 8. The line speeds are in inches per minute (centimeters per minute). The Post-Heat values for the samples are also shown in Table 8.

TABLE 8

| Sample | Line Speed | T | Haze | Sheet Resistance |
|---|---|---|---|---|
| 2f | 11 (28) | 76.8 | 5.85 | 12.3 |
| 2g | 8 (20) | 75.5 | 7.52 | 16.20 |
| 2h | 6 (15) | 75.9 | 7.62 | 24-30 |
| 2i | 6 (15) | 77.4 | 7.34 | 26.5 |
| 2j | 4 (10) | 74.8 | 7.89 | 19.5 |
| 2k | 2 (5) | 74.9 | 8.79 | 35.45 |
| 7e | 8 (20) | 81.1 | 2.23 | 12.2 |
| 8d | 8 (20) | 82.2 | 2.09 | 23.25 |
| 13f | 8 (20) | 88 | 0.14 | 10.5 |

It will be readily appreciated by one of ordinary skill in the art that modifications may be made to the invention without departing from the concepts disclosed in the foregoing description. Accordingly, the particular aspects described in detail herein are illustrative only and are not limiting to the scope of the invention, which is to be given the full breadth of the appended claims and any and all equivalents thereof.

What is claimed is:

1. An organic light emitting diode, comprising:
a substrate;
a first electrode;
an emissive active stack; and
a second electrode,
wherein at least one of the first electrode and the second electrode is a light extracting electrode comprising a metallic layer, and wherein the metallic layer comprises light scattering features on and/or in the metallic layer, and further comprising an underlayer located between the metallic layer and the substrate, the underlayer between the metallic layer and the substrate comprising a zinc oxide layer over a zinc stannate layer.

2. The organic light emitting diode of claim 1, wherein the light scattering features are selected from the group consisting of projections, dendrites, cracks, voids, regions of different density than the metallic layer, and regions of different chemical composition than the metallic layer.

3. The organic light emitting diode of claim 1, wherein the light scattering features comprise projections.

4. The organic light emitting diode of claim 3, wherein at least a portion of the projections have a height in the range of 10 nm to 60 nm.

5. The organic light emitting diode of claim 1, wherein at least a portion of the light scattering features are dendrite-shaped.

6. The organic light emitting diode of claim 5, wherein at least a portion of the dendrite-shaped light scattering features have a diameter in the range of 10 microns to 50 microns.

7. The organic light emitting diode of claim 1, wherein the metallic layer comprises metallic silver.

8. The organic light emitting diode of claim 1, wherein the light extracting electrode is a multilayer structure comprising the metallic layer with the light scattering features.

9. The organic light emitting diode of claim 1, wherein the light extracting electrode is an anode.

10. The organic light emitting diode of claim 1, including a top layer over the metallic layer.

11. The organic light emitting diode of claim 10, wherein the top layer comprises at least one oxide material selected from the group consisting of oxides of zinc, tin, zirconium, aluminum, silicon, indium, and mixtures thereof.

12. The organic light emitting diode of claim 1, wherein the first electrode is opaque and/or reflective.

13. The organic light emitting diode of claim 1, wherein the substrate comprises glass, wherein the first electrode is a cathode, wherein the light extracting electrode is an anode, wherein the light scattering features comprise projections extending from a first surface of the substrate, and wherein at least some of the projections have a height in the range of 20 nm to 60 nm.

14. The organic light emitting diode of claim 1, wherein the substrate comprises glass, wherein the first electrode is a cathode, wherein the first electrode is opaque and/or reflective, wherein the light extracting electrode is an anode, wherein the anode is closer to the substrate than the first electrode, wherein the metallic layer comprises metallic silver, wherein the light scattering features comprise projections extending from a first surface of the substrate, and wherein at least a portion of the projections have a height in the range of 10 nm to 60 nm.

15. The organic light emitting diode of claim 14, including a top layer over the metallic layer, wherein the top layer comprises at least one oxide material selected from the group consisting of oxides of zinc, tin, zirconium, aluminum, silicon, indium, and mixtures thereof.

16. A method of making an organic light emitting diode, comprising:

provide a first electrode, an emissive active stack, a second electrode over a substrate, wherein at least one of the first electrode and the second electrode is a light extracting electrode comprising a metallic layer, and wherein the metallic layer comprises light scattering features on and/or in the metallic layer, and the organic light emitting diode further comprising an underlayer located between the metallic layer and the substrate, the underlayer between the metallic layer and the substrate comprising a zinc oxide layer over a zinc stannate layer, wherein the light scattering features are provided by at least one process selected from:

exposing the metallic layer to oxygen;
heating the metallic layer;
exposing the metallic layer to a laser;
exposing the metallic layer to an oxygen plasma treatment; and
doping the metallic layer.

* * * * *